United States Patent

Tanaka et al.

[11] Patent Number: 5,940,528
[45] Date of Patent: Aug. 17, 1999

[54] PROCESS FOR POSITIONING OF A MASK RELATIVE TO ANOTHER MASK, OR MASKS RELATIVE TO A WORKPIECE AND DEVICE FOR EXECUTING THE PROCESS

[75] Inventors: Yoneta Tanaka, Kanagawa-ken; Manabu Goto, Yokohama, both of Japan

[73] Assignee: Ushiodenki Kabushiki Kaisha, Tokyo, Japan

[21] Appl. No.: 08/688,006

[22] Filed: Jul. 29, 1996

[30] Foreign Application Priority Data

Jul. 28, 1995 [JP] Japan .................................. 7-192947

[51] Int. Cl.$^6$ ...................................................... G06K 9/00
[52] U.S. Cl. ........................................... 382/151; 382/145
[58] Field of Search .................................. 382/151, 152, 382/153; 356/139.04, 139.05, 399, 400, 401; 430/22, 5; 359/754, 760

[56] References Cited

U.S. PATENT DOCUMENTS 5,159,496  10/1992  Kataoka ..................................... 430/22
5,418,092   5/1995  Okamoto ..................................... 430/5
5,721,079   2/1998  Goto ......................................... 430/22

*Primary Examiner*—Jose L. Couso
*Assistant Examiner*—Duy M. Dang
*Attorney, Agent, or Firm*—Sixbey, Friedman, Leedom & Ferguson; David S. Safran

[57] ABSTRACT

A process for positioning, in which a dummy is not used, in which multichromatic light can be used as the light source for purposes of alignment, and in which aberration correction is unnecessary, and a device for executing the process is achieved according to the invention by executing projection onto a first mask by projection lenses in which at least the workpiece facing sides of the lenses are telocentric. In a state in which a workpiece is remote, light with exposure wavelengths is emitted from a light irradiation part onto a second mask. The first mask (or second mask) is moved such that the projected images of the alignment marks of the second mask and the alignment marks of the first mask come to lie on top of one another. Furthermore, the irradiation light is branched off by beam splitters and positions of the alignment marks of the second mask are stored. Next, emission of the light with exposure wavelengths is stopped, a workpiece is inserted into a predetermined position, from another light irradiation part light multichrome with nonexposure wavelengths is emitted, positions of the alignment marks of the workpiece are determined and the workpiece is moved to bring these alignment marks into position on top of the stored position of the alignment marks of the second mask.

5 Claims, 7 Drawing Sheets

PROCESS FOR POSITIONING OF A MASK RELATIVE TO ANOTHER MASK, OR MASKS RELATIVE TO A WORKPIECE AND DEVICE FOR EXECUTING THE PROCESS

BACKGROUND OF THE INVENTION

1. Field of the Invention

The invention relates to a process for positioning of one mask relative to another mask or positioning of a plurality of masks relative to a workpiece, and to a device for executing the process in an exposure device which is used for production of a semiconductor device, a printed board, a liquid crystal display and the like.

2. Description of Related Art

Production of electrical and electronic components and parts of different types in which processing of structures in the micron range is necessary comprises an exposure process. These electronic parts are semiconductor components, liquid crystal displays, printer heads of the ink jet type, multichip modules in which a plurality of various electronic components are produced on a substrate and thus a module is formed, and the like.

A double-sided exposure system is used as one of these exposure systems, in which mask patterns, which are located above and below the workpiece, are transferred to both of its sides. In such double-sided exposure systems, the masks located above and below are positioned relative to one another, and thus, the patterns which are transferred to the surface and back of the workpiece are positioned relative to one another. Then, the masks are positioned relative to the workpiece. Patterns to be subsequently transferred are positioned exactly relative to the patterns on the workpiece which were formed beforehand.

The above described positioning is conventionally done such that alignment marks of the two masks come to lie on top of one another, and that the alignment marks of the masks and the workpiece come to lie on top of one another.

FIG. 6 schematically shows the conventional positioning of the masks relative to one another and of the masks relative to the workpiece in the above described double-sided exposure system.

In the drawing, the arrangement of a top mask M1, a bottom mask M2, top and bottom projection lenses L1 and L2, and alignment units A1, A2, each of which comprise, for example, a mirror, two lenses and an imager (CCD), is shown. Furthermore, a dummy D for positioning of upper mask M1 relative to lower mask M2 is provided having dummy alignment marks DAM on both side thereof.

In the following, using FIG. 6, the positioning of the masks relative to one another and the positioning of the masks relative to the workpiece are described:

A. Positioning of the masks relative to one another (1) The dummy D is inserted between the projection lens L1 and the projection lens L2. On both sides of the dummy D alignment marks DAM are recorded.

(2) By irradiation with light of exposure wavelengths, the alignment marks MA1 of upper mask M1 and alignment marks MA2 of lower mask M2 are projected onto the respective sides of the dummy.

(3) Alignment unit A1 is inserted between projection lens L1 and dummy D and Alignment unit A2 is inserted between projection lens L2 and dummy D.

(4) Upper mask M1 and lower mask M2 are moved by a mask carrier movement device (not shown in this figure), such that the projected images of the alignment marks MA1 of upper mask M1, the projected images of the alignment marks MA2 of the lower mask M2 and the dummy alignment marks DAM are brought to lie on top of one another by monitoring of the projected images on dummy D by means of the imagers of alignment units A1 and A2. In this way positioning is performed.

B. Positioning of the masks relative to the workpiece (1) Dummy D and alignment unit A2 are removed and the workpiece is inserted in place of the dummy D. Workpiece alignment marks for positioning relative to the alignment marks of the above described masks are recorded on the workpiece.

(2) Light with nonexposure wavelengths is radiated through the upper mask M1 and projection lens L1.

(3) As a result of the optical construction of projection lens L1 (likewise projection lens L2) with regard to the exposure light wavelengths, an imaging error or aberration occurs, by which deviations of the imaging positions of the alignment marks MA1 of mask M1 from the positions on the top of the workpiece occur. Upper mask M1 and projection lens L1 are, therefore, moved in the direction of the Z-axis (up and down in FIG. 6) at the same time by means of a Z-axis movement device which is not shown in the drawings, and thus the above described deviations are corrected (for this principle, reference is made to Japanese patent application HEI 6-242532 and its counterpart, U.S. Ser. No. 08/540,390, which was filed in the name of one of the present inventors, and which is commonly owned with this application).

(4) The workpiece is moved such that the workpiece alignment marks on the top of the workpiece agree with the projection images of alignment marks MA1 of upper mask M1 by monitoring by means of the imagers of alignment unit A1. In this way, alignment is performed.

(5) Alignment unit A1 are removed. Upper mask M1 which was moved according to above described item (3) and projection lens L1 are moved back into their previous positions.

In the above described art, however, the following is considered disadvantageous:

A. Positioning of the upper mask relative to the lower mask (1) It is difficult to produce dummy D in which alignment marks DAM of the two sides are in a set positional relationship with respect to one another.

(2) The workpiece does not always have a constant thickness, and can have different thicknesses. It is, therefore, necessary to make available a dummy D for each thickness of the workpiece. Furthermore, there are workpieces in which the positions of the alignment marks are different, the dummy must be prepared according to the workpiece alignment marks.

Especially in the case of alignment using dummy D with a thickness which differs from the thickness of the workpiece, the two sides of the workpiece cannot be exposed at the same time, and step-by-step exposure must be performed. This means that, here, it is necessary to move the positions of the projection lens and the workpiece in the direction of the Z-axis, and to expose the other side of the workpiece after alignment and exposure have been performed for the first side of the workpiece.

(3) It is necessary to position the upper mask relative to the lower mask every two to five minutes, and to insert the dummy each time in order to correct deviations of the positional relationship of the upper mask to the lower mask which occur due to temperature changes. Especially when the device is started, there are large temperature changes within it. In this case, it is necessary to frequently correct the above described positional deviations.

B. Positioning of the upper and lower masks relative to the workpiece and in double-sided exposure (1) Due to use of light with nonexposure wavelengths during workpiece alignment, the aberration correction described in item (3) in the above described prior art must be done for the respective alignment.

However, it is unnecessary to accomplish the above described aberration correction if, with respect to the light with the exposure wavelengths (for example of the g-line), high image resolution is accomplished and a projection lens with a small aberration both with respect to light with exposure wavelengths and also with respect to light with nonexposure wavelengths (for example of the e-line) is used, as is shown in FIG. 7. However it is difficult to produce a lens of this type.

(2) The light with nonexposure wavelengths must be monochrome light. This means that width $\Delta Z$ in the imaging positions (aberration becomes greater), and as a result thereof, a deviation occurs if the light with nonexposure wavelengths has a wavelength width of $\Delta\lambda$ to a certain extent, as is shown in FIG. 8. It is therefore necessary to use monochrome light for the light with nonexposure wavelengths. The wavelength width as monochrome light is a half width of roughly ±2 nm.

In the case of using monochrome light however interference of light which is reflected from the photoresist surface occurs with the light which is reflected from the workpiece surface (or the surface of the base). This means that the resist layer thickness is roughly 1 to 5 microns; however, it has a variation of roughly 0.1 micron to 0.2 microns, as is shown in FIG. 9. Therefore as a result of the variation of the resist layer thickness, interference bands occur, as is shown for example in FIG. 10; this makes alignment difficult.

(3) If, hypothetically, the light with exposure wavelengths is emitted as alignment light, it is necessary to separately place an irradiation unit for the light with exposure wavelengths (inserting it above the upper mask M1) for purposes of partial illumination and to irradiate the alignment marks of upper mask M1. However, even if the irradiation unit for light with exposure wavelengths is used for purposes of partial illumination, in the areas used for positioning on the workpiece, a circuit pattern or the like cannot be formed since, during positioning, the resist in the vicinity of the workpiece alignment marks is exposed to the action of exposure light. As a result, the areas which can be used become smaller.

(4) In the case of using light with exposure wavelengths, it is difficult for the light to reach the surface of the workpiece (or the surface of the base), since the light with exposure wavelengths is easily absorbed by the photoresist. Therefore, it becomes difficult to determine the alignment marks.

SUMMARY OF THE INVENTION

The invention was made to eliminate the above described disadvantages in the prior art.

Therefore, a first object of the invention is to devise a process for positioning of one mask relative to another, in which a dummy is not used, and in which, furthermore, deviations of the positional relationship of an upper mask to a lower mask as a result of temperature changes can be easily corrected, and to devise a device for executing the process.

A second object of the invention is to devise a process for positioning an upper mask and a lower mask relative to a workpiece, in which no aberration correction is necessary, in which, furthermore, it is unnecessary to produce a projection lens which has small aberration both with respect to the light with exposure wavelengths and also with respect to the light with nonexposure wavelengths, and to devise a device for executing the process.

A third object of the invention is to devise a process for positioning an upper mask and a lower mask relative to a workpiece, in which multichromatic light can be used as the light source for alignment, in which no interference bands are formed which are caused by variation of the resist layer thickness, and in which alignment marks are easily determined, and to devise a device for executing the process.

A fourth object of the invention is to devise a process for positioning an upper mask and a lower mask relative to a workpiece in which, during positioning, the resist on the workpiece is not exposed to the action of exposure light, and in which circuit patterns can be formed in the areas used for positioning, and to devise a device for executing the process.

The above described objects are achieved according to a first embodiment in that positioning of one mask relative to another mask is done by emitting light with exposure wavelengths from a first light irradiation part onto alignment marks of a first mask, by recording alignment marks of the second mask and the projection images of the alignment marks of the first mask and subjecting them to image processing, projecting them through a first projection lens and a second projection lens onto the second mask, in which at least the sides opposite the mask sides are telecentric, by computing the data of the relative positions of the two alignment marks, and by moving the second mask and/or the first mask such that the above described two alignment marks come to lie on top of one another.

The above described objects are achieved according to a second embodiment in that positioning of masks relative to a workpiece is performed in a state in which the workpiece is remote, light with exposure wavelengths is emitted from a first light irradiation part onto alignment marks of a first mask, the alignment marks of a second mask and projection images of the alignment marks of the first mask are recorded and are projected onto the second mask through a first projection lens and a second projection lens, in which at least the workpiece sides are telecentric, then the relative positions of the two alignment marks are determined, and based on data of the relative positions of the above described two alignment marks, the second mask and/or the first mask is/are moved such that the two alignment marks come to lie on top of one another. Furthermore, the light which irradiates the alignment marks of the first mask is deflected or branched between the first projection lens and the second projection lens, the alignment marks of the first mask are recorded, the relative positions thereof are determined/ stored, after which emission of the light with the exposure wavelengths from the first light irradiation part is stopped, a workpiece is inserted in a predetermined position between the first projection lens and the second projection lens, and light with nonexposure wavelengths is emitted from a second light irradiation part onto alignment marks of the workpiece, the alignment marks of the workpiece are recorded and their relative positions are determined/stored. Based on the previously stored data of the relative positions of the alignment marks of the first mask and based on data of the relative positions of the alignment marks of the workpiece, the workpiece is moved such that the two come to lie on top of one another.

The above described objects are achieved according to a third embodiment in that positioning of masks to a workpiece is done by the fact that in a state in which the workpiece is remote, from a first light irradiation part light with exposure wavelengths is emitted onto alignment marks of a first mask, that the light which irradiates the alignment marks of the above described first mask is transmitted by a first projection lens, in which at least the workpiece side is telecentric, that the above described transmission light is branched into first branched light and second branched light, that the above described first branched light is transmitted by a second projection lens in which at least the workpiece side is telecentric, that projection images of the alignment marks of the first mask which are projected onto the second mask, and alignment marks of the second mask are recorded, that relative positions of the two alignment marks are determined, that using the above described second branched light the alignment marks of the above described first mask are recorded, that the relative positions thereof are determined/stored, that based on data of the relative positions of the above described two alignment marks the second mask and/or the first mask is/are moved such that the above described two alignment marks come to lie on top of one another, that emission of the light with exposure wavelengths from the first light irradiation part is stopped, that a workpiece is inserted in a stipulated position between the first projection lens and the second projection lens, that from a second light irradiation part light with nonexposure wavelengths is emitted onto alignment marks of the workpiece, that the alignment marks of the above described workpiece are recorded and their relative positions are determined/stored, that based on the previously stored data of the relative positions of the alignment marks of the first mask and based on data of the relative positions of the alignment marks of the above described workpiece, the workpiece is moved such that the two come to lie on top of one another.

The above described objects are achieved according to a fourth embodiment in that, in a device for positioning one mask relative to another mask, there are a first mask, a first mask carrier movement device for moving the first mask, a first projection lens, of which at least the side opposite the mask side is telecentric, a second mask, a second mask carrier movement device for moving the second mask, a second projection lens, of which at least the side opposite the mask side is telecentric, a light irradiation part for irradiating alignment marks of the first mask with light with the exposure wavelengths, a camera means which records projection images of the alignment marks of the first mask by the light with exposure wavelengths emitted from the light irradiation part and records the alignment marks of the second mask, and a control means which, based on the image data recorded by the camera means controls the first mask carrier movement part and/or the second mask carrier movement part. Furthermore, the control means records the alignment marks of the second mask and the projection images of the alignment marks of the first mask which are projected through the first projection lens and the second projection lens onto the second mask, performs image processing and determines the relative positions thereof, if the light irradiation part emits light with exposure wavelengths, and the control means computes the data of the relative positions of the two alignment marks and moves the second mask and/or the first mask such that the two alignment marks come to lie on top of one another.

The above described objects are achieved according to a fifth embodiment by the fact that, in a device for positioning of masks relative to a workpiece, there are a first mask, a first mask carrier movement device for moving the above described first mask, a first projection lens, of which at least the side opposite the mask side is telecentric, a workpiece, a workpiece carrier movement device for moving the workpiece, a second mask, a second mask carrier movement device for moving the second mask, a second projection lens, in which at least the side opposite the mask side is telecentric, a first light irradiation part for irradiating alignment marks of the first mask with light with exposure wavelengths, a second light irradiation part for irradiating alignment marks of the workpiece with light with nonexposure wavelengths, a first camera means which records projection images of the alignment marks of the first mask by the light with exposure wavelengths emitted from the first light irradiation part and records the alignment marks of the second mask, a light branching means for branching the light which irradiates the alignment marks of the first mask between the first projection lens and the second projections lens, or a light deflection means for deflecting the irradiation light, and a second camera means which records projection images of the alignment marks of the first mask by the light branched by means of the light branching means, or the light deflected by the light deflection means, and records the alignment marks of the workpiece by the light with nonexposure wavelengths emitted from the second light irradiation part. Furthermore, a control means which, based on the image data recorded by the first camera means, controls the first mask carrier movement device and/or the second mask carrier movement device, which controls the first mask carrier movement device and/or the second mask carrier movement device based on the image data recorded by the first camera means, and which controls the workpiece carrier movement device based on the image data recorded by the second camera means. In the state in which the workpiece is remote, the control means has the light irradiation part emit light with exposure wavelengths, the control means records the alignment marks of the second mask and the projection images of the alignment marks of the first mask which are projected through the first projection lens and the second projection lens onto the second mask, performs image processing and determines the relative positions thereof, then the control means computes data of the relative positions of the alignment marks of the second mask and the projection images of the alignment marks of the first mask, moves the second mask and/or the first mask such that the two come to lie on top of one another. Additionally, the control means records the projection images of the alignment marks of the above described first mask by the branched light in which the light irradiating the alignment marks of the above described first mask was branched between the first projection lens and the second projection lens, or by the deflected light in which the irradiation light was deflected, performs image processing and determines/stores the relative positions thereof, after which the control means stops emission of light with exposure wavelengths from the first light irradiation part and inserts the workpiece in a predetermined position between the first projection lens and the second projection lens. Then, the control means has the second light irradiation part emit light with nonexposure wavelengths, records the alignment marks of the workpiece, performs image processing and determines the relative positions thereof, and based on the previously stored data of the relative positions of the alignment marks of the first mask and based on the data of the relative positions of the alignment marks of the workpiece, the control means moves the workpiece such that the two come to rest on top of one another.

The above described objects are achieved according to a sixth embodiment by the fact that, in a device for positioning of masks relative to a workpiece, there are a first mask, a first mask carrier movement device for moving the above described first mask, a first projection lens, of which at least the side opposite the mask is telecentric, a workpiece, a workpiece carrier movement device for moving the workpiece, a second mask, a second mask carrier movement device for moving the second mask, a second projection lens, of which at least the side opposite the mask is telecentric, a first light irradiation part for irradiating alignment marks of the first mask with light with the exposure wavelengths, a second light irradiation part for irradiating alignment marks of the workpiece with light with nonexposure wavelengths, a first camera means which records projection images of the alignment marks of the first mask by the light with exposure wavelengths emitted from the first light irradiation part and records the alignment marks of the second mask, a light branching means for branching of the light which irradiates the alignment marks of the first mask between the first projection lens and the second projections lens, a second camera means which records projection images of the alignment marks of the first mask by the light branched by means of the above described light branching means, and records the alignment marks of the workpiece by the light with nonexposure wavelengths emitted from the second light irradiation part, and a control means which, based on the image data recorded by the first camera means controls the first mask carrier movement device and/or the second mask carrier movement device and which controls the workpiece carrier movement device based on image data recorded by the second camera means. Furthermore, in the state in which the workpiece is remote, the control means has the light irradiation part emit light with exposure wavelengths, and the control means records the alignment marks of the second mask and the projection images of the alignment marks of the first mask which are projected through the first projection lens and the second projection lens onto the second mask, performs image processing, and determines the relative positions thereof. At the same time, the control means records the projected images of the alignment marks of the first mask by the branched light in which the light which irradiates the alignment marks of the first mask was branched between the first objective lens and the second objective lens, performs image processing and determines/stores the relative positions thereof. The control means computes data of the relative positions of the alignment marks of the second mask and the projected images of the alignment marks of the first mask, causes the second mask and/or the first mask to be moved such that the two come to lie on top of one another, and then the control means stops emission of the light with exposure wavelengths from the first light irradiation part and inserts the workpiece in a predetermined position between the first projection lens and the second projection lens, and has the second light irradiation part emit light with nonexposure wavelengths, records the alignment marks of the workpiece, performs image processing and determines the relative positions thereof. Additionally, the control means, based on the previously stored data of the relative positions of the alignment marks of the first mask and based on the data of the relative positions of the alignment marks of the workpiece causes the movement of the workpiece such that the two come to rest on top of one another.

In the invention described above with respect to the first and fourth embodiments, light with exposure wavelengths is emitted from the light irradiation part onto the alignment marks of the first mask. In this case, furthermore, the alignment marks of the second mask and the projection images of the alignment marks of the first mask are recorded and undergo image processing and are projected through the first projection lens and the second projection lens onto the second mask, of which at least the sides opposite the mask sides are telecentric, and their relative positions are determined. Furthermore, the data of the relative positions of the two alignment marks are computed and the second mask and/or the first mask is moved such that the two alignment marks come to lie on top of one another. By this measure, positioning of one mask relative to another can be done without using a dummy which is difficult to manufacture and in which the alignment marks on the two sides have a set relationship to one another. Additionally, it is no longer necessary by the measure according to the invention to make available a dummy according to each thickness of the workpiece.

In addition, according to the invention, deviations as a result of temperature changes can be easily corrected since, in the correction of the deviations of the positional relationship of the upper mask relative to the lower mask as a result of temperature changes, no dummy need be inserted.

In the invention described in the above relative to the second, third, fifth and sixth embodiments, positioning of one mask relative to another mask is performed in the same way as with respect to the first and fourth embodiments, and furthermore, the light which irradiates the alignment marks of the first mask is branched or deflected, the alignment marks of the first mask are recorded, their relative positions are determined/ stored, then emission of the light with exposure wavelengths from the first light irradiation part is stopped, the workpiece is inserted in a predetermined position, the light with nonexposure wavelengths is emitted onto the alignment marks of the workpiece, the relative positions of the alignment marks of the workpiece are determined/stored and based on the previously stored data of the relative positions of the alignment marks of the first mask and based on the data of the relative positions of the workpiece, the workpiece is moved such that the two come to lie on top of one another. By means of this measure, positioning of masks relative to a workpiece can be performed without aberration correction. Furthermore, according to the invention, it is not necessary to use an expensive projection lens which is difficult to produce and which has an aberration which is small both with respect to the light with exposure wavelengths and also with respect to light with nonexposure wavelengths.

According to the invention, moreover, multichromatic light with nonexposure wavelengths can be used as the light which illuminates the alignment marks of the workpiece. Therefore, the alignment marks can be easily determined without formation of the above described interference bands or the like. Therefore, it is unnecessary to use an extra irradiation unit for the light with exposure wavelengths for purposes of partial illumination. Furthermore, exposure of the resist on the workpiece due to the action of exposure light during positioning is prevented, by which effective use of the alignment areas on the workpiece is enabled.

In the following, the invention is further described using several embodiments shown in the drawings.

DETAILED DESCRIPTION OF THE PREFERRED EMBODIMENTS

Figure 1:
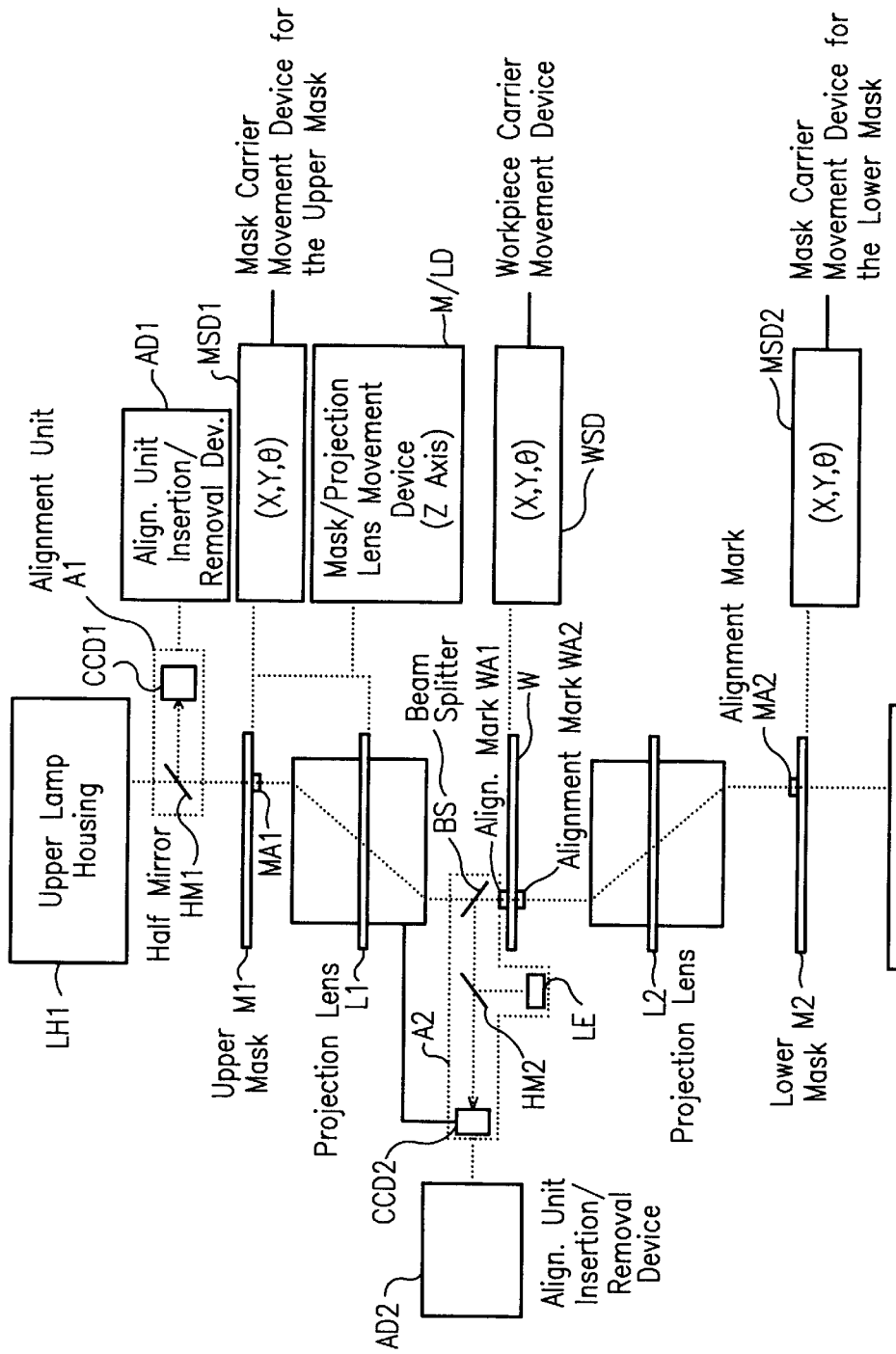
FIG. 1 shows a schematic of the arrangement of one embodiment of a positioning device according to the invention.

FIG. 1 is a schematic depiction of an embodiment of a positioning device according to the invention in which an upper lamp housing LH1 and a lower lamp housing LH2 each contain a lamp (not shown) from which light with exposure wavelengths is emitted for irradiating upper and lower masks M1, M2 (described below) via shutters, optical filters, condenser lenses, and the like.

A first alignment unit A1 is comprised of a half mirror HM1, two lenses (not shown), an imager CCD1 or the like. By means of first alignment units A1, the alignment marks of the first mask M1 and a workpiece W are recorded. Alignment units A1 are inserted and removed by alignment unit insertion and removal devices AD1.

On upper mask M1 and lower mask M2, are recorded patterns for projection onto the workpiece W and mask alignment marks M1 and MA2. Upper mask M1 and lower mask M2 are, furthermore, attached to mask carriers (not shown) and these mask carriers are moved by means of a mask carrier movement device for the upper mask MSD1 and a mask carrier movement device for the lower mask MSD2 in the X-Y-Θ directions (i.e., to the right, left, front and back in the drawing and in a direction of rotation around an axis which is perpendicular to the mask surfaces).

Figure 2:
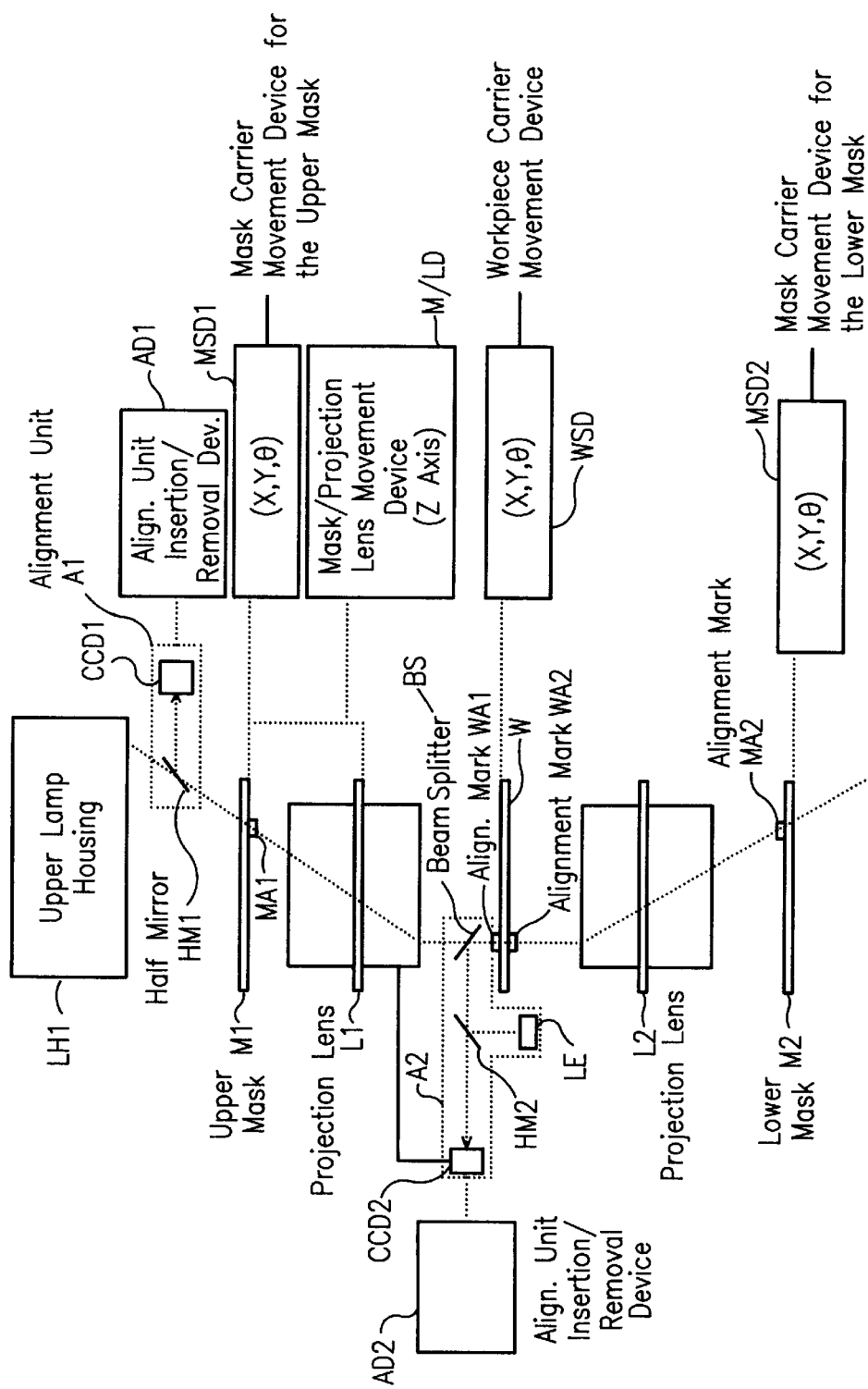
FIG. 2 shows a schematic of another embodiment in which lenses which are telocentric on one side are used.

Reference numbers L1 and L2 designate projection lenses which, in this embodiment, are telecentric lenses in which both sides, i.e., both the workpiece side of the lenses L1 and L2 and the mask side of the lenses L1 and L2, are telocentric. However, lenses which are telecentric on only one side can also be used, in which only the lenses on the workpiece sides of projection lenses L1 and L2 are telecentric, as is shown in FIG. 2. Projection lens L1 is, furthermore, driven in the Z direction (up and down in the drawing) by means of a mask/projection lens drive device M/LD integrally with the mask carrier on which the mask M1 is attached.

Furthermore, a second alignment unit A2 is provided which is comprised of a beam splitter BS, a half mirror HM2, two lenses (not shown), and an imager CCD2. Reference letters LE indicate an irradiation device for multichromatic light with nonexposure wavelengths. The alignment marks of workpiece W are irradiated with the multichromatic nonexposure light which is supplied by the irradiation devices LE via the half mirrors HM2 and the beam splitter BS. Images of the alignment marks on the workpiece W are recorded by the imager CCD2 via the beam splitters BS, half mirrors HM2 and the two lenses.

Alignment units A2 and the irradiation devices LE are mechanically coupled to the projection lens L1, so that they move together with the projection lens L1 in the Z-direction. Furthermore, alignment unit A2 and the irradiation devices for multichromatic light with nonexposure wavelengths LE are arranged such that they can move in the X-Y directions independently of the motion of the projection lens L1, and they are inserted and removed by means of an alignment unit insertion and removal devices AD2 in the direction of the arrow.

Workpiece W has alignment marks WA1 and WA2 for positioning on its upper and lower sides. Workpiece W is attached to a workpiece carrier (not shown) which is driven by means of workpiece carrier movement device WSD in the X-Y-Θ direction (i.e., to the right, left, forward, and backward in the drawing and in a direction of rotation around an axis which is perpendicular to the vertical axis).

Figure 3:
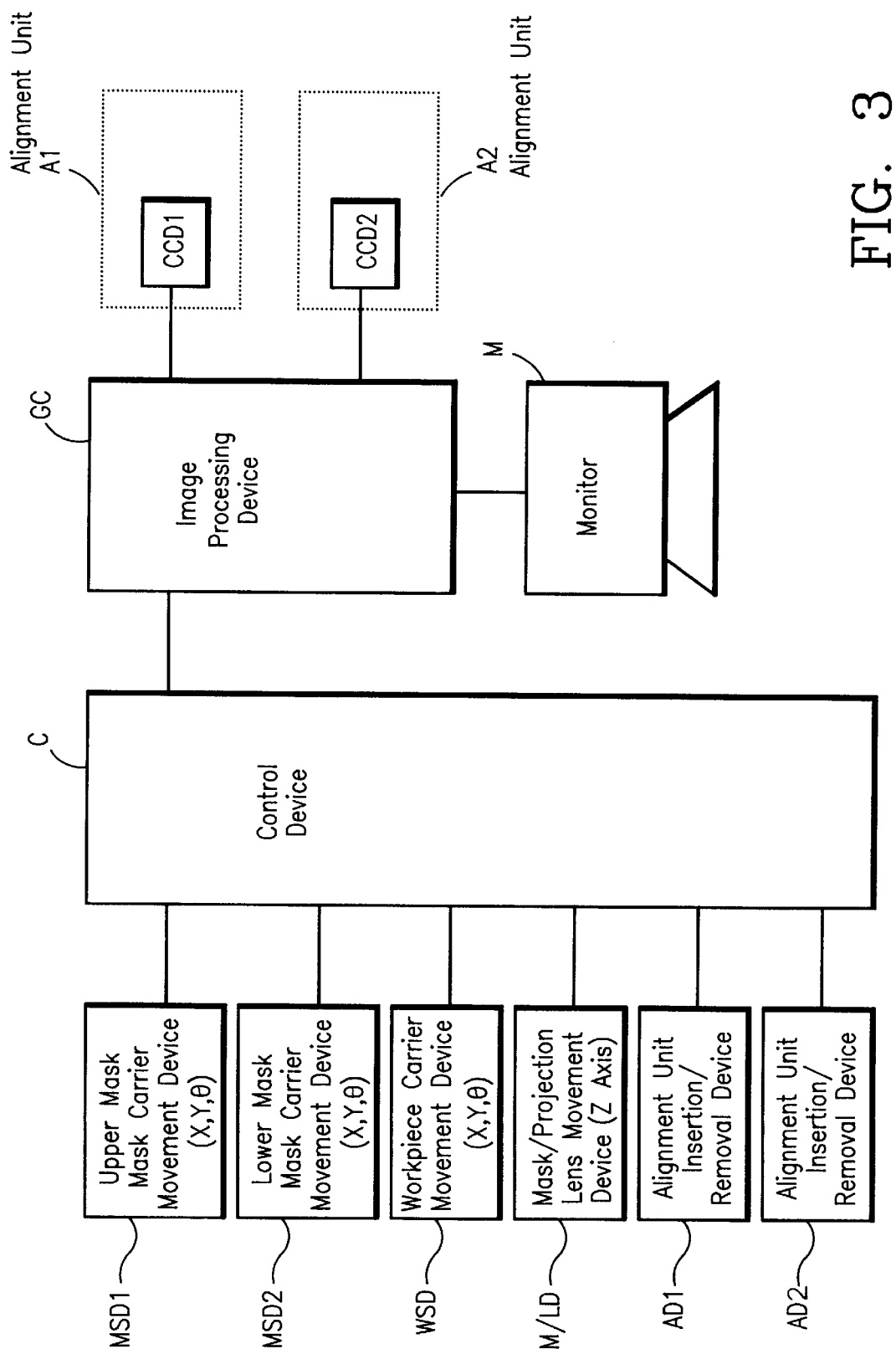
FIG. 3 shows a schematic of the system arrangement according to the invention.

FIG. 3 is a schematic of the arrangement of the control system of the embodiment shown in FIG. 1. The same parts as in FIG. 1 are labeled with the same reference numbers and letters as in FIG. 1. Furthermore, C indicates a control device for controlling the above described movement devices and the like, reference letters GC identify an image processing device for processing the images of the alignment marks of the masks/workpiece, which are recorded the imagers CCD1 of alignment units A1 and CCD2 of alignment units A2, and reference letter M indicates a monitor.

In the following, using a first and a second embodiment, "(1) positioning of one mask relative to another mask according to the invention" and "(2) positioning of the masks relative to a workpiece" will be described. This positioning according to the invention is described in the following with reference to FIG. 1. However, it can be done entirely in the same way with reference to the embodiment of FIG. 2.

A. First Embodiment (1) Positioning of the upper mask relative to the lower mask (a) Upper mask M1 and lower mask M2 are moved in the z-direction beforehand by means of the mask carrier movement device for the upper mask MSD1 and the mask carrier movement device for the lower mask MSD2, and are positioned such that upper mask M1 and lower mask M2 are at the imaging ratio with respect to alignment marks WA2 on the bottom side of workpiece W. This positioning, however, can also be performed such that the upper mask M1 and the lower mask M2 are at the imaging ratio for the alignment marks WA1 on the upper side of workpiece W.

(b) Alignment units A1 are inserted above the upper mask M1 by means of the alignment unit insertion and removal devices AD1.

Figure 4:
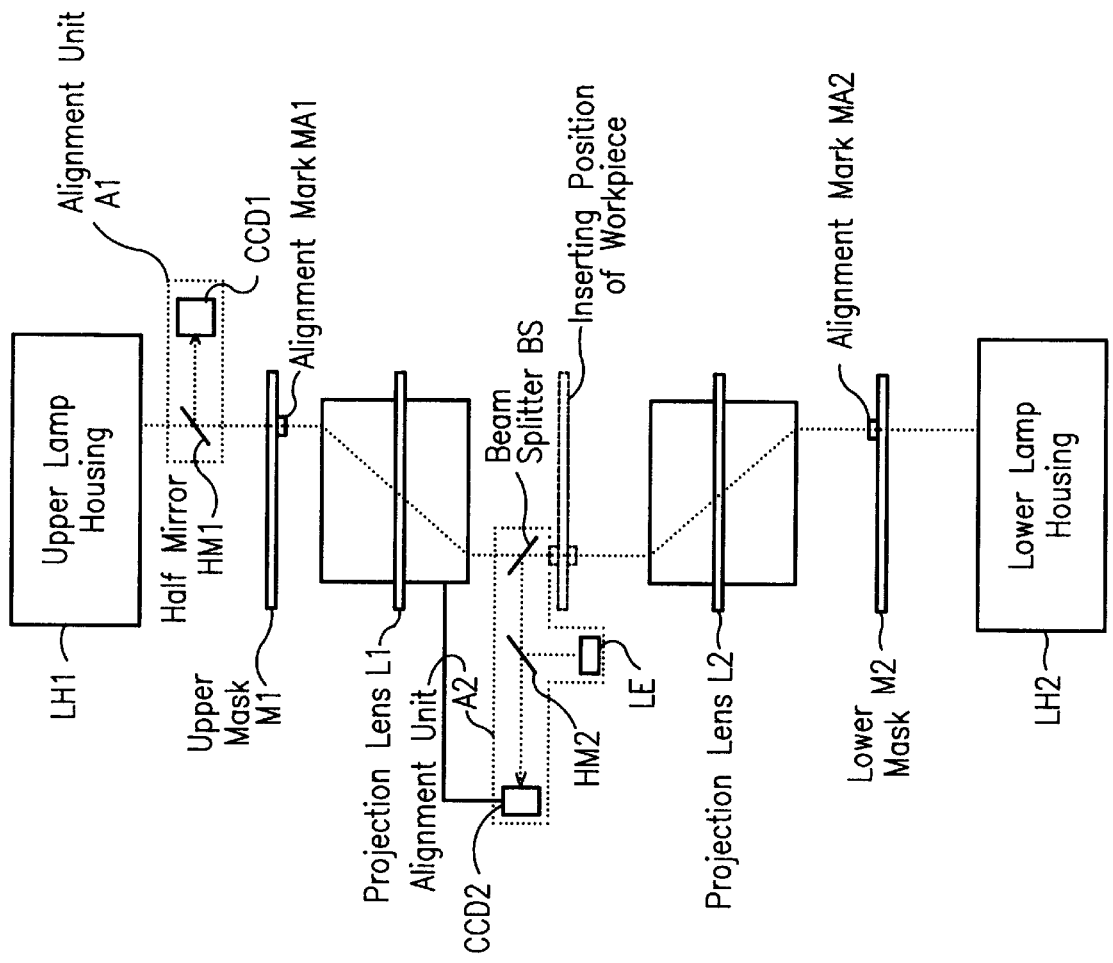
FIG. 4 shows a schematic showing positioning of one mask relative to another mask.
Figure 6:
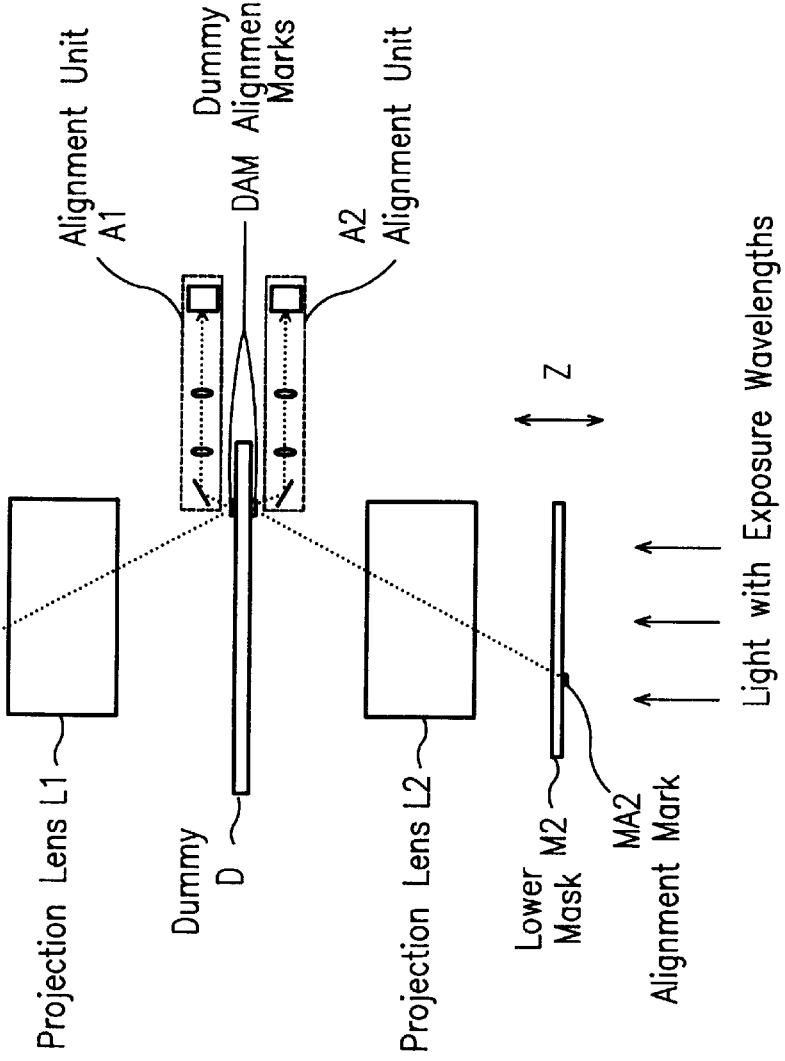
FIG. 6 shows a schematic of a conventional arrangement.

(c) In the state shown in FIG. 4, in which no workpiece is present, light with exposure wavelengths is emitted from the lower lamp housing LH2. Alignment marks MA2 of lower mask M2 are necessarily projected onto predetermined positions of the upper mask M1 because projection lenses L1 and L2 are telecentric, as is shown in FIGS. 1 and 2. However, in this case, the light with exposure wavelengths can also be emitted from the upper lamp housing LH1. In this case, alignment units A1 are inserted under the mask M2.

(d) By means of the imager CCD1 of the alignment units A1, the alignment marks MA1 of the upper mask M1 and the projection images of alignment marks MA2 of the lower mask M2 are recorded and subjected to image processing by means of the image processing device GC shown in FIG. 3. Upper mask Ml and/or lower mask M2 are moved by means of the mask carrier movement device for the upper mask MSD1 and the mask carrier movement device for the lower mask MSD2, and positioning of upper mask M1 to lower mask M2 is performed.

This positioning can be done automatically by means of the above described image processing device GC and the control device C. However, it can also be performed manually by the operator watching monitor M.

(2) Positioning of the upper and lower masks to the workpiece

After positioning of the upper mask M1 relative to the lower mask M2 has been completed, as was described above, positioning of the upper and lower masks M1, M2 relative to the workpiece W is performed as described below.

(a) Alignment units A2 are inserted by means of the alignment unit insertion and removal devices AD2 into positions in which the alignment marks MA2 of lower mask M2 can be determined.

(b) Illumination light (light with exposure wavelengths) is emitted from lower lamp housing LH2. Some of it is branched by means of beam splitters BS of alignment units A2 and is recorded by the imagers CCD2 of alignment units A2. The recorded images of the alignment marks are processed by means of image processing device GC and the positions of alignment marks MA2 of lower mask M2 are determined and stored.

(c) Workpiece W is moved by means of workpiece carrier movement device WSD and is inserted in a predetermined position, as was described above using FIG. 1.

(d) The upper mask M1 and the projection lens L1 are moved in the Z-direction (to the top) by means of mask/projection lens movement device M/LD based on the thickness of workpiece W. In this way, projection lens L1, upper mask M1 and the upper side of workpiece W are brought into the imaging ratio.

As was described above, projection lens L1 and alignment units A2 are mechanically coupled in the Z-direction. Alignment units A2 are consequently moved upward, likewise, by the same amount. The imaging positions of alignment units A2 are changed from alignment marks WA2 on the bottom of workpiece W to alignment marks WA1 on the upper side of workpiece W.

If, as in the above described item (1)(a), positioning is performed such that the upper mask M1 and the lower mask M2 are at the imaging ratio relative to the alignment marks WA1 on the upper side of workpiece W, the projection lens L1 and the upper mask M1 are moved down according to the thickness of workpiece W.

(e) The multichromatic light with nonexposure wavelengths with which alignment marks WA1 are irradiated on the top of workpiece W is emitted from irradiation devices LE of alignment units A2.

(f) Alignment marks WA1 on the top of workpiece W are recorded by the imager CCD2 of alignment units A2. The recorded images of the alignment marks are processed by means of image processing device GC, and the positions of alignment marks WA1 of workpiece W are determined.

(g) By means of image processing device GC, the amount of deviation of the positions of alignment marks MA2 of lower mask M2 which were stored in above described item (b) is determined by the positions of alignment marks WA1 of the workpiece W which were determined in above described item (f).

(h) Workpiece W is moved by means of workpiece carrier movement device WSD such that the positions of alignment marks MA2 of lower mask M2 are brought into agreement with the positions of alignment marks WA1 of workpiece W. In this way, alignment is effected.

Above described processes (g) and (h) can be done automatically by means of image processing device GC and control device C. However, they can also be performed manually by the operator watching monitor M.

B. Second Embodiment (1) Positioning of the upper mask to the lower mask

In the processes described below, processes (b) and (e) differ from the first embodiment, while other processes are identical to it.

(a) As in item (a) of the first embodiment, upper mask M1 and lower mask M2 are moved in the z-direction beforehand and are positioned such that upper mask M1 and lower mask M2 are at the imaging ratio relative to alignment marks WA2 on the bottom side of workpiece W. This positioning, however, can also be performed such that upper mask M1 and lower mask M2 are at the imaging ratio relative to the alignment marks WA1 on the upper side of the workpiece W, as in the first embodiment.

(b) Alignment units A1 are inserted above upper mask M1 by means of alignment unit insertion and removal devices AD1. Furthermore, by means of alignment unit insertion and removal devices AD2 alignment units A2 are inserted into positions in which alignment marks MA2 of lower mask M2 can be determined.

(c) In the state in which there is no workpiece, light with exposure wavelengths is emitted from lower lamp housing LH2, as in the first embodiment. Alignment marks MA2 of the lower mask M2 are projected onto predetermined positions of the upper mask M1. However, in this case, the light with exposure wavelengths can also be emitted from upper lamp housing LH1, as in the first embodiment. In this case, alignment unit A1 is inserted under the lower mask M2.

(d) As in the first embodiment, alignment marks M1 of upper mask M1 and the projected images of the alignment marks MA2 of lower mask M2 are recorded by the imagers CCD1 of alignment units A1, and thus, positioning of upper mask M1 to lower mask M2 is achieved.

(e) Together with execution of positioning according to above described item (d), some of the illumination light (light with exposure wavelengths) from lower lamp housing LH2 which is branched off by means of the beam splitters BS of alignment unit A2 is recorded by the imagers CCD2 and the positions of alignment marks MA2 of lower mask M2 are stored.

In this embodiment, simultaneously with positioning of upper mask M1 relative to lower mask M2, the light from lower lamp housing LH2 is branched by beam splitters BS and recorded by imagers CCD2. Therefore, it is advantageous that the thickness of beam splitters BS is extremely small (for example, a pellicle).

Figure 5:
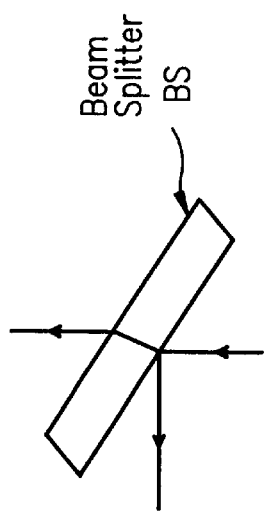
FIG. 5 schematically shows the deviation of the optical path through a beam splitter.
Figure 7:
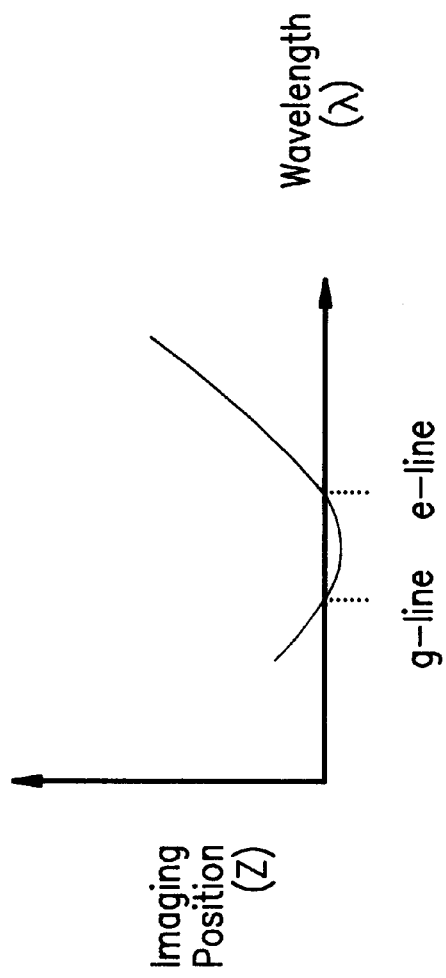
FIG. 7 is a graph depicting the characteristics of a projection lens which has a small aberration both with respect to g-line and also with respect to e-line light.
Figure 8:
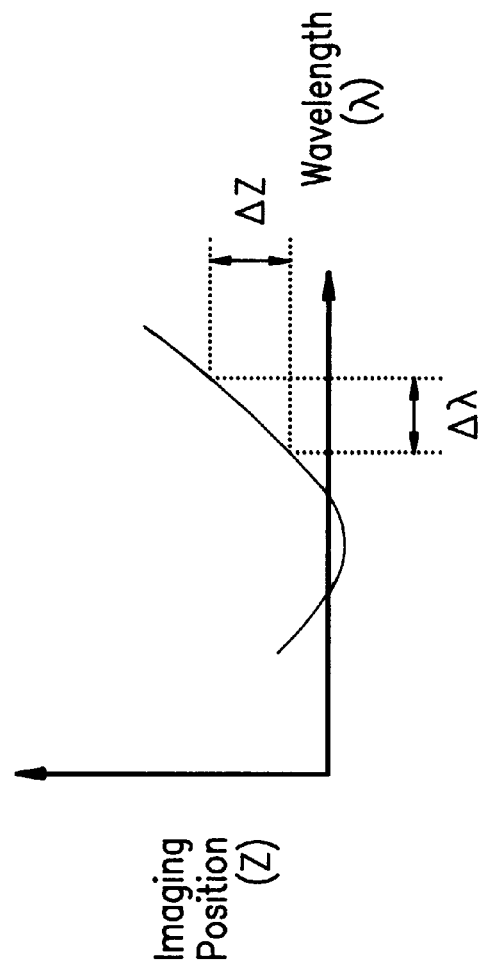
FIG. 8 is a graph depicting the relationship between imaging position and light wavelength for light with non-exposure wavelengths.
Figure 9:
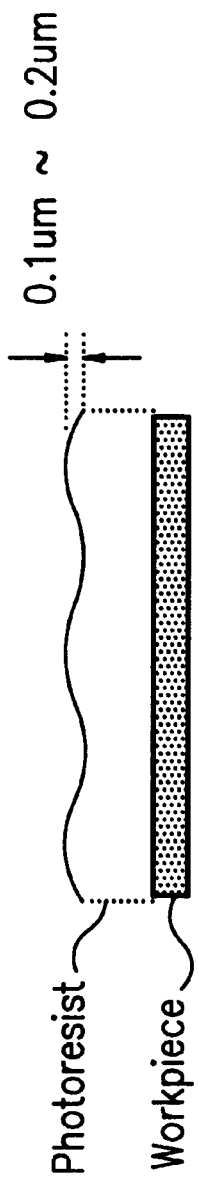
FIG. 9 schematically depicts the variation of photoresist layer thickness on a workpiece.
Figure 10:
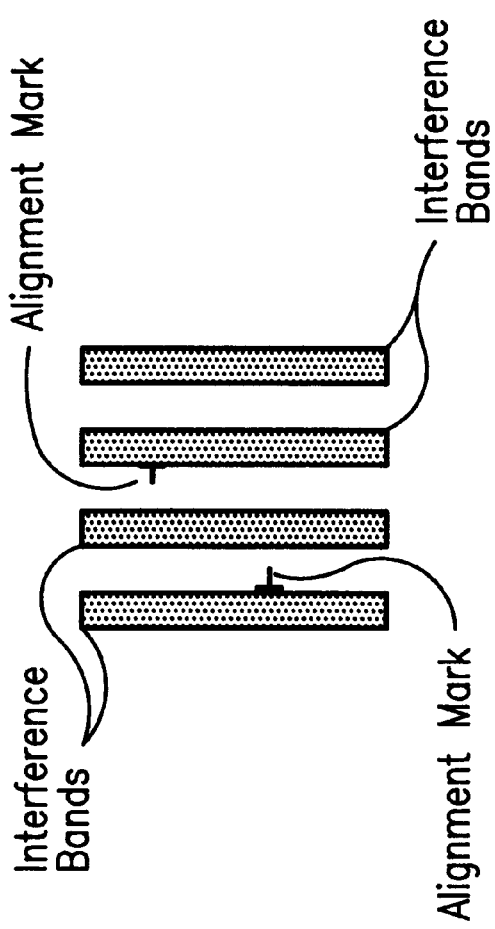
FIG. 10 shows a schematic of a state in which interference bands and alignment marks have come to lie on top of one another.

This means that when light passes through the beam splitters, the optical path deviates by an amount which corresponds to the thickness of the beam splitters BS, as is illustrated in FIG. 5. If positioning of upper mask M1 relative to the lower mask M2 is performed in the state in which beam splitters BS are inserted, therefore, the positions of upper mask M1 and lower mask M2 deviate according to the above described deviation of the optical path. As a result, it is necessary to reduce the above described amount of position deviation by using a beam splitters with an extremely low thickness.

(2) Positioning of the upper and the lower masks to the workpiece

In this embodiment, in the process of positioning the upper and lower masks relative to a workpiece, insertion of the workpiece is begun, which was described above in item (2)(c) in connection with the first embodiment, because in item (1), alignment units A2 were inserted and the positions of the alignment marks MA2 of lower mask M2 were stored. Other process steps are identical to those of the first embodiment.

This means that positioning of the upper and lower masks relative to the workpiece is performed in the manner described below.

(a) Workpiece W is inserted in a predetermined position.

(b) Upper mask M1 and projection lens L1 are moved according to the thickness of workpiece W in the Z-direction (upward). In this way, projection lens L1, upper mask M1 and the upper side of workpiece W are brought into the imaging ratio.

If in above described item (1)(a) positioning is performed such that upper mask M1 and lower mask M2 are at the imaging ratio with respect to alignment marks WA1 on the upper side of workpiece W, the projection lens L1 and upper mask M1 are moved down according to the thickness of workpiece W, as in the first embodiment.

(c) Multichromatic light with nonexposure wavelengths is emitted from the irradiation devices LE and with which the alignment marks WA1 are irradiated on the top of workpiece W.

(d) Alignment marks WA1 on the upper side of workpiece W are recorded and the positions of the alignment marks WA1 of workpiece W are determined.

(e) The amount of deviation of the positions of alignment marks MA2 of the lower mask M2 which were stored in the above described step (1)(e) is determined by the positions of alignment marks WA1 of the workpiece W which were determined in the above described step (d).

(f) Workpiece W is moved by means of the workpiece carrier movement device WSD such that the positions of the alignment marks MA2 of lower mask M2 are brought into agreement with the positions of the alignment marks WA1 of workpiece W. In this way, alignment is effected.

As was described above, with respect to the second embodiment of the invention, in the positioning of upper mask M1 relative to lower mask M2, at the same time, the positions of alignment marks MA2 of lower mask M2 are stored. It is therefore unnecessary to store the positions of alignment marks MA2 in the positioning of the masks relative to the workpiece, as in the first embodiment. In this way, the number of process steps can be reduced as compared to the first embodiment.

On the other hand, in the second embodiment, it is necessary, as was described above, to use a relatively costly beam splitters BS with a low thickness, by which the disadvantage of higher costs of the device occurs as compared to the first embodiment.

In the above described first and second embodiments, according to the section "(1) Positioning of the upper and lower masks to one another", in step (a), upper mask M1 and projection lens L1 are moved in the Z-direction. However, likewise, projection lens L2 and lower mask M2 can thus move in the Z-direction by the mask/projection lens movement device M/LD being located on the side of the projection lens L2 and lower mask M2.

A case of executing the positioning of the upper mask M1 and the lower mask M2 relative to the workpiece W was described above, since the two sides are exposed at the same time. However, the device can also be used according to this embodiment for step-by-step exposure, in which one side of the workpiece is exposed after the other. This means that, in FIG. 1, there is a device for moving the workpiece carrier in the Z direction, and first, positioning of the upper mask M1 relative to the lower mask M2 is performed, as was described above. Next, positioning of upper mask M1 (lower mask M2) relative to workpiece W is performed and the upper side (lower side) of the workpiece is exposed. Then, the workpiece W is moved up (down) according to the thickness of the workpiece and the lower side (upper side) of the workpiece is exposed.

By means of the above described step-by step exposure, the projection lens L1 and upper mask M1 projection lens L2 and lower mask M2) need not be moved, as in the above described first and second embodiments, but it is sufficient to move workpiece W in the Z-direction. In this way, accuracy can be increased. In step-by-step exposure, in comparison to the above described double-sided exposure, throughput decreases since exposure of one side after the other is performed. If, however, the exposure duration is short, it can be used in practice to a sufficient degree.

Action of the Invention

As was described above, according to the invention the following effects can be obtained.

(1) By means of the measure according to the invention by which light with exposure wavelengths is emitted onto the alignment marks of a upper mask, by which alignment marks of a second mask and projection images of the alignment marks of the upper mask are recorded and are subjected to image processing, and are projected through a first projection lens and a lower projection lens onto the lower mask, in which at least the sides of the lenses which are opposite the mask sides are telecentric, by which relative positions are determined by which the lower mask and/or the upper mask,is/are moved such that the above described two alignment directions come to lie on top of one another, the following effects can be obtained:

(a) Positioning of one mask relative to another mask can be achieved without using a dummy which is difficult to manufacture, in which the alignment marks are at a predetermined relationship on the two sides. Furthermore, it is no longer becomes necessary by the measure according to the invention to prepare a dummy according to each thickness of the workpiece.

(b) In the correction of deviations of the positional relationship of the upper mask to the lower mask as a result of temperature changes, a dummy need not be inserted. Especially upon starting of the device within which there are strong temperature changes, is it necessary to often correct the position deviations of the upper mask from the lower mask as a result of temperature changes. However according to the invention the deviations of position of the upper mask from the position of the lower mask can be easily corrected, since a dummy need not be inserted, as was described above. In this way operation can be facilitated.

(2) By means of the measure according to the invention, by which positioning of one mask relative to another mask is performed in the same way as in above described item (1), by which the light irradiating the alignment marks of the upper mask,is branched, by which the alignment marks of the upper mask,are recorded and their relative positions are determined/stored, by which emission of the light with exposure wavelengths is stopped, by which the workpiece is inserted in a given position, by which the light with nonexposure wavelengths is emitted onto the alignment marks of the workpiece, by which the relative positions of the alignment marks of the workpiece are determined/stored, and by which as a result of the previously stored data of the relative positions of the alignment marks of the upper mask,and based on the data of the relative positions of the alignment marks of the above described workpiece, the workpiece is moved such that the two come to lie on top of one another, the following effects can be obtained:

(a) Positioning of masks relative to a workpiece can be done without aberration correction. Furthermore, according to the invention a costly projection lens which is difficult to manufacture and which has aberration which is small both with respect to the light with exposure wavelengths and also with respect to light with nonexposure wavelengths need not be used. In this way, operation of the device can be facilitated and the cost of the device reduced.

(b) Multichromatic light with nonexposure wavelengths can be used as the light which illuminates the alignment marks of the workpiece, and therefore, formation of the above described interference bands or the like can be prevented. Furthermore, the light with nonexposure wavelengths reaches the surface of the workpiece, since the light with nonexposure wavelengths is not easily absorbed by the photoresist. Therefore, the alignment marks can be easily determined.

According to the invention therefore the positions of the alignment marks can be easily determined by means of an image processing device and automatic positioning can be done.

Furthermore, it is unnecessary to use a separately placed irradiation unit for the light with nonexposure wavelengths for purposes of partial illumination.

(c) Furthermore, exposure of the resist on the workpiece to the action of exposure light during positioning is prevented. Therefore, in the areas used for positioning, circuit patterns can be formed and effective use of the areas on the workpiece can be achieved.

It is to be understood that, although preferred embodiments of the invention has been described, various other embodiments and variations may occur to those skilled in the art. Any such other embodiments and variations which fall within the scope and spirit of the present invention are intended to be covered by the following claims.

We claim:

1. Device for positioning of masks to a workpiece, comprising: a first mask, a first mask carrier movement device for moving the first mask, a first projection lens of which at least a side which faces the first mask is telecentric, a workpiece, a workpiece carrier movement device for moving the workpiece, a second mask, a second mask carrier movement device for moving the second mask, a second projection lens of which at least a side which faces the second mask is telecentric, a first light irradiation part for irradiating alignment marks of the first mask with light with the exposure wavelengths, a second light irradiation part for irradiating alignment marks of the workpiece with light with nonexposure wavelengths, a first camera means for recording projected images of the alignment marks of the first mask produced by the light with exposure wavelengths emitted from the first light irradiation part and for recording the alignment marks of the second mask, a light branching means for branching off a portion of the light which is emitted by the first light irradiation part at a location between the first projection lens and the second projections lens, a second camera means for recording projected images of the alignment marks of the first mask produced by the light branched off by means of the light branching means and for recording the alignment marks of the workpiece produced by the light with nonexposure wavelengths emitted from the second light irradiation part, and a control means for controlling movement of at least one of the first mask carrier movement device and the second mask carrier movement device based on image data recorded by the first camera means and for controlling movement of the workpiece carrier movement device based on image data recorded by the second camera means, causing the first light irradiation part to emit light with exposure wavelengths while the workpiece is at a remote location, the control means recording the alignment marks of the second mask and the projected images of the alignment marks of the first mask which are projected through the first projection lens and the second projection lens onto the second mask and image processing them, then determining the relative positions thereof, and at the same time, the control means recording projected images of the alignment marks of the first mask produced by the branched off light which irradiates the alignment marks of the first mask, image processing them and determining/storing the relative positions thereof, the control means computing data of relative positions of the alignment marks of the second mask and the projected images of the alignment marks of the first mask, and causing the mask carrier movement devices to move at least one of the second mask and the first mask into position one on top of the other, the control means thereafter stopping emission of the light with exposure wavelengths from the first light irradiation part, causing the workpiece to be inserted into a predetermined position between the first projection lens and the second projection lens, and actuating the second light irradiation part to emit light with nonexposure wavelengths, and after which the control means records the alignment marks of the workpiece, image processes them and determines the relative positions thereof, the control means, based on previously stored data of the relative positions of the alignment marks of the first mask and based on the data of the relative positions of the alignment marks of the workpiece, operates the workpiece carrier movement device for moving the workpiece so as to cause the alignment marks of workpiece and of the first mask to lie one on top of the other.

2. Device for positioning of masks relative to a workpiece, comprising:

a first mask, a first mask carrier movement device for moving the first mask, a first projection lens of which at least a side which faces the first mask is telecentric, a workpiece, a workpiece carrier movement device for moving the workpiece, a second mask, a second mask carrier movement device for moving the second mask, a second projection lens of which at least a side which faces the second mask is telecentric, a first light irradiation part for irradiating alignment marks of the first mask with light with exposure wavelengths, a second light irradiation part for irradiating alignment marks of the workpiece with light with nonexposure wavelengths, a first camera means for recording projected images of the alignment marks of the first mask produced by the light with exposure wavelengths emitted from the first light irradiation part and for recording the alignment marks of the second mask, a light branching means for branching off a portion of the light emitted by the first light irradiation part at a point located between the first projection lens and the second projections lens, a second camera means for recording projected images of the alignment marks of the first mask via the light branched off by the light branching means and for recording images of the alignment marks of the workpiece received via the light with nonexposure wavelengths emitted from the second light irradiation part, and a control means for controlling movement of at least one of the first mask carrier movement device and the second mask carrier movement device based on image data recorded by the first camera means and for controlling the workpiece carrier movement device based on image data recorded by the second camera means by causing first the light irradiation part to emit light with exposure wavelengths while the workpiece is at a remote location, the control means recording the alignment marks of the second mask and the projected images of the alignment marks of the first mask which are projected through the first projection lens and the second projection lens onto the second mask, image processing and determining the relative positions of the alignment marks of the second mask and the projected images of the alignment marks of the first mask, computing data of the relative positions of the alignment marks of the second mask and the projected images of the alignment marks of the first mask, and then moving said at least one of the second mask and the first mask to cause the projected images of the alignment marks of the first mask and the alignment marks of the second mask to lie one on top of the other, the control means recording the projected images of the alignment marks of the first mask via the branched-off light, image processing them and determining/storing the relative positions thereof, after which the control means stops emission of light with exposure wavelengths from the first light irradiation part, causes the workpiece carrier movement device to insert the workpiece in a predetermined position between the first projection lens and the second projection lens, causes the second light irradiation part to emit light with nonexposure wavelengths, the control means recording the alignment marks of the workpiece, image processing them and determining the relative positions thereof, and based on previously stored data of the relative positions of the alignment marks of the first mask and based on the data of the relative positions of the alignment marks of the workpiece, the control means causes the workpiece carrier movement device to move the workpiece so as to bring alignment marks of the workpiece and the alignment marks of the first mask in to position one on top of the other.

3. Process for positioning of masks to a workpiece, wherein in a state in which the a workpiece is remote, from a first light irradiation part light with exposure wavelengths is emitted onto alignment marks of a first mask, that the light which irradiates the alignment marks of the above described first mask is transmitted by a first projection lens, in which at least the workpiece side is telecentric, that the above described transmission light is branched into first branched light and second branched light, that the above described first branched light is transmitted by a second projection lens in which at least the workpiece side is telecentric, that projection images of the alignment marks of the first mask which are projected onto the second mask, and alignment marks of the second mask are recorded, that relative positions of the two alignment marks are determined, that using the above described second branched light the alignment marks of the above described first mask are recorded, that the relative positions thereof are determined/stored, that based on data of the relative positions of the above described two alignment marks the second mask and/or the first mask is/are moved such that the above described two alignment marks come to lie on top of one another, that emission of the light with exposure wavelengths from the first light irradiation part is stopped, that a workpiece is inserted in a stipulated position between the first projection lens and the second projection lens, that from a second light irradiation part light with nonexposure wavelengths is emitted onto alignment marks of the workpiece, that the alignment marks of the above described workpiece are recorded and their relative positions are determined/stored, that based on the previously stored data of the relative positions of the alignment marks of the first mask and based on data of the relative positions of the alignment marks of the above described workpiece, the workpiece is moved such that the two come to lie on top of one another.

4. Device for positioning a first mask having a pattern thereon for projection onto a workpiece relative to a second mask having a pattern thereon for projection onto a workpiece, comprising a first mask, a first mask carrier movement device for moving the first mask, a first projection lens at least a side of which that faces the mask being telecentric, a second mask, a second mask carrier movement device for moving the second mask, a second projection lens at least a side of which that faces the mask being telecentric, a light irradiation part for irradiating alignment marks of the first mask with light with the exposure wavelengths, a camera means which records projected images of the alignment marks of the first mask produced by the light with exposure wavelengths emitted from the light irradiation part and which records the alignment marks of the second mask, and a control means for controlling movement of at least one of the first mask carrier movement part and the second mask carrier movement part based on image data recorded by the camera means by said control means recording and image processing the alignment marks of the second mask and the projected images of the alignment marks of the first mask which are projected through the first projection lens and the second projection lens onto the second mask, determining the relative positions thereof and computing data of the relative positions of the two alignment marks and then moving at least one of the second mask carrier movement part and said first mask carrier movement part to bring said alignment marks of the first and second masks to lie one on top of the other.

5. Process for positioning of first and second masks relative to a workpiece, comprising the steps of:

in a state in which the workpiece is remote, emitting light with exposure wavelengths from a first light irradiation part onto alignment marks of the first mask so as to produce projected images thereof;

recording alignment marks of the second mask and the projected images of the alignment marks of the first mask;

directing the projected images onto the second mask through a first projection lens and a second projection lens, of which at least sides of the lenses that face a predetermined workpiece position being telecentric;

determining relative positions of the alignment marks of the first and second masks;

moving at least one of the second mask and the first mask based on data of the relative positions of the alignment marks thereof so as to cause the alignment marks of the second mask and the first mask to come to lie one on top of the other;

branching off a portion of the light emitted from the first light irradiation part for irradiating the alignment marks of the first mask at a point between the first projection lens and the second projection lens, recording the alignment marks of the first mask and determining/storing relative positions thereof when the light irradiation part emits the light with exposure wavelengths;

stopping emission of the light with the exposure wavelengths from the first light irradiation part and inserting a workpiece into said predetermined workpiece position between the first projection lens and the second projection lens;

emitting light from a second light irradiation part light with nonexposure wavelengths onto alignment marks of the workpiece;

recording the alignment marks of the workpiece and determining/storing relative positions thereof;

based on the previously stored data of the relative positions of the alignment marks of the first mask and based on data of the relative positions of the alignment marks of the workpiece, moving the workpiece so as to bring the alignment marks of the workpiece and the alignment marks of the first mask to lie one on top of the other.

* * * * *